United States Patent
Koiwa et al.

[11] Patent Number: 5,907,187
[45] Date of Patent: May 25, 1999

[54] ELECTRONIC COMPONENT AND ELECTRONIC COMPONENT CONNECTING STRUCTURE

[75] Inventors: Kaoru Koiwa, Kawasaki, Japan; Koji Yamakawa, State College, Pa.; Kiyoshi Iyogi; Takaaki Yasumoto, both of Kawasaki, Japan; Nobuo Iwase, Kamakura, Japan

[73] Assignee: Kabushiki Kaisha Toshiba, Kanagawa-ken, Japan

[21] Appl. No.: 08/502,587

[22] Filed: Jul. 14, 1995

[30] Foreign Application Priority Data

Jul. 18, 1994 [JP] Japan .................................. 6-165101

[51] Int. Cl.$^6$ .......................... H01L 23/48; H01L 23/52; H01L 29/40; H01L 23/06
[52] U.S. Cl. .......................... 257/737; 257/738; 257/779; 257/703; 257/772
[58] Field of Search .................................. 257/737, 738, 257/772, 777, 778, 779, 780

[56] References Cited

U.S. PATENT DOCUMENTS

| | | | |
|---|---|---|---|
| 3,871,015 | 3/1975 | Lin et al. ................................. | 257/778 |
| 4,536,786 | 8/1985 | Hayakawa et al. ..................... | 257/737 |
| 4,604,644 | 8/1986 | Beckham et al. ....................... | 257/738 |
| 5,216,278 | 6/1993 | Lin et al. ................................. | 257/737 |
| 5,569,960 | 10/1996 | Kumazawa et al. .................... | 257/738 |

FOREIGN PATENT DOCUMENTS

| | | | |
|---|---|---|---|
| 59-208768 | 11/1984 | Japan ..................................... | 257/772 |
| 2-105560 | 4/1990 | Japan ..................................... | 257/697 |

*Primary Examiner*—Mahshid D. Saadat
*Assistant Examiner*—Jhihan B Clark
*Attorney, Agent, or Firm*—Finnegan, Henderson, Farabow, Garrett & Dunner, L.L.P.

[57] ABSTRACT

In such electronic components as semiconductor packages and semiconductor chips which are possessed of groups of connecting bumps as input and output terminals, the groups of connecting bumps comprise not less than two kinds of connecting bumps different in melting point or not less than two kinds of connecting bumps different in mechanical strength. The groups of connecting bumps comprise connecting bumps made of high temperature solder or connecting bumps made of a high strength In type solder in the part of formation thereof. The connecting bumps made of high temperature solder are not directly affected by the influence of displacement because they retain the shape of a ball even after the step of connection such as solder reflow. The connecting bumps made of In type solder form connecting parts of high strength. These groups of connecting bumps contribute to exalt the reliability of the connecting parts without decreasing the number of input and output terminals.

12 Claims, 7 Drawing Sheets

ELECTRONIC COMPONENT AND ELECTRONIC COMPONENT CONNECTING STRUCTURE

BACKGROUND OF THE INVENTION

1. Field of the Invention

This invention relates to an electronic component possessed of connecting projections as input and output terminals and an electronic component connecting structure electrically connected through the medium of the connecting projections.

2. Description of the Related Art

Various packages formed of ceramic, resinous, metallic, and other materials and intended to mount thereon such semiconductor devices as LSI are tending toward larger densification, fuller adaptation for high speed operation, and more thorough heat release in consequence of the steady trend of LSI toward greater integration, higher operating speed, more power consumption, and more extensive conversion of components into chips. Further, the utility of these semiconductors has disseminated to the extent of covering such industrial products as work stations, personal computers, miniature computers, and large computers and such electronic appliances as portable devices, printers, copiers, cameras, television sets, and video sets. Moreover, the semiconductors themselves have been enjoying continuous improvement in quality.

The packages which serve to mount LSI's of high quality and large integration thereon are required to be capable of permitting connection of the LSI's thereto by means of multiple terminals of narrow pitches, allowing amply dense wiring, releasing heat sufficiently, handling high-speed signals, and admitting multiple terminals of narrow pitches for their input and output terminals. Further, the necessity for perfecting a technique which permits packages of high quality satisfying these requirements to be manufactured inexpensively by a simple procedure with high reliability has been finding widespread recognition.

First, as means to connect a package to semiconductor elements with multiple terminals of narrow pitches, the wire bonding method, the TAB method, the flip chip method, and others have been heretofore known. The wire bonding has been undergoing successive automation and has been most widely adopted to date. Since it can be accommodated to packages differing in mode of programming, it is adaptable to the small-lot great-variety manufacture of packages. In terms of the trend toward narrowing pitches, the technique of the latest development permits bonding with pitches of the order of 100 $\mu$m.

The TAB method is at an advantage in permitting collective bonding of chips of multiple terminals, rendering the bonded chips fit to be tested, reducing inductance on account of large lead, and promising an effective heat release by a Cu lead as a radiating path for the LSI. Thus, it is used for liquid crystal driver grade IC's and gate arrays. The flip chips are partly used for high-performance computers, LSI testers, work stations, and others. They are at an advantage in reducing the area for packaging and, at the same time, decreasing the parasitic inductance, capacity, etc. due to the lead junction.

For the sake of enabling such connecting techniques as mentioned above to function effectively, the relevant packages likewise require an inner lead part using narrow pitches and multiple terminals. Further, it has become essential that the connection of such packaging boards as substrates for printed circuits to packages similarly require densification (increase in the number of components per chip) by increasing the number of terminals and narrowing the size of pitches. This connection further demands due consideration of electrical characteristics because the packages themselves require to handle high-speed signals owing to the trend of LSI's toward increasing operating speed as mentioned above.

To meet this trend of packages toward increasing number of terminals and decreasing size of pitches, the package structures are now in transition from the conventional pin insertion type to the surface mount type such as QFP (quad flat package). In the package structures of the surface mount type, those which have large numbers of terminals and high speeds of operation include the SM-PGA (surface mount type pin grid array) packages and narrow pitch QFP packages, for example. The surface mount type packages which use pins and leads, however, incur difficulty in further decreasing the size of pitches because they have such pins and leads joined to their packages proper. A hard problem from the viewpoint of process is encountered in decreasing the size of pitches below 1.27 mm in PGA packages and below 0.3 mm in QFP packages, for example. These packages are further at a disadvantage in requiring such works as solder printing and mounting to be carried out at elevated temperatures when components are mounted on substrates for printed circuits and others.

The PGA and the QFP packages which are possessed of pins and leads, when so operated as to handle signals of high speeds, entrain the problem of inducing reflection of the signals owing to the high-frequency characteristics and aggravated delay of the signals owing to the inductance component because the effect of inductance is exalted in the parts of pins and leads. Even when the inductance is decreased as by controlling the characteristic impedance or providing a power source or a ground surface for the purpose of adapting the multilayer wiring structure of a package proper for an operation of a high speed, the degradation of the characteristics in the parts of pins and leads mentioned above is so heavy as to render difficult the adaptation for signals of high speeds.

The BGA (ball grid array) package was proposed for the solution of such problems as mentioned above. At first, it found utility in super computers and other large computers. Recently, it has been finding growing utility in such household products as personal computers and portable implements. The BGA is a package structure which uses connecting projections such as, for example, solder bumps as input and output terminals for a package. Owing to the use of solder bumps which are capable of decreasing the distance of connection, such problems as the reflection, delay, etc. of high-speed signals by the inductance which originate in the pins and the leads mentioned above can be eliminated.

The formation of bumps, in addition to permitting a decrease in the distance of connection, facilitates the increase in number of terminals and the decrease in size of pitches. Thus, the BGA promises as a future LSI package. The success of the bumps in attaining a decrease in the size of pitches and an increase in the number of terminals can be expected to reduce the size of package itself, improve the density of package as on a substrate for a printed circuit, enhance the electrical characteristics by lowering the parasitic capacity, the inductance, the resistance, etc. of a wiring, and improve the high-frequency characteristics owing to the reduction of the size of package. Further, the BGA, having no pins nor leads which are easy to bend, contribute to facilitate the packaging work as compared with that in the SM-PGA package using pitches of 1.27 mm or that in the QFP package using pitches of 0.3 mm.

From the viewpoint of the heat release from a package, the power consumption and the amount of heat to be generated are both on the increase year after year owing to the trend of LSI's toward increasing speeds of operation. The packages themselves, therefore, require a structure and a material which both excel in the ability to release heat. For packages of high radiation, ceramic packages are mainly used. Packages using ceramic materials predominate, though there are packages which use a metallic material in their main bodies and packages which comprise a printed circuit, use a resinous material, and incorporate therein a heat sink for radiation. In the ceramic packages, those which use such a highly conductive material as aluminum nitride (AlN) are utilized as offering particularly low thermal resistance.

The BGA packages using ceramic materials are high-density packages which enjoy high heat release and excellent electrical characteristics and, at the same time, permit an increase in the number of terminals and a decrease in the size of pitches as described above and are expected to find utility as packages for semiconductor devices of heightened speeds of operation and increased degrees of densification. The BGA packages which use ceramic materials, however, are at a disadvantage in respect that, when they are actually mounted as on substrates for printed circuits, the solder parts destined to serve as connecting parts have poor reliability because the thermal expansion coefficient of a ceramic substrate and that of a printed circuit are widely different. The thermal stress which is generated by this difference of thermal expansion is ascribable partly to the thermal hysteresis which occurs in the step of solder reflow during the mounting of the BGA package on a printed circuit and to the change of the ambient temperature during the course of normal use of the BGA package. In any event, owing to the large difference in thermal expansion between the ceramic package and the printed circuit, the stress is concentrated in the connecting parts with solder bumps which have low mechanical strength. This concentration of stress in the connecting parts entrains the problem of inflicting a crack in the connecting parts or fracturing the connecting parts and impairing the reliability of electrical connections and mechanical connections.

Meanwhile, the feasibility of improving the shapes of the connecting parts by solder bumps, namely the shapes the solder bumps assume after they are melted, for the purpose of solving such problems as mentioned above is now being studied. In terms of shape, by imparting the general shape of an hourglass to the connecting parts with solder bumps, the parts in which stress is concentrated can be shifted from the interfaces between the connected parts and the printed circuit to the central portions of the connected parts and the reliability of these connected parts can be consequently exalted.

Since the hourglass shapes of the connected parts are different from the shapes (like spheres or drums) which the connected parts assume when their solder is naturally melted, however, the distances between the opposed surfaces which are being connected must be controlled for the purpose of imparting the shape of an hourglass to all the connected parts. Thus, the feasibility of controlling the distances between the opposed surfaces being connected by having a spacer inserted between a package and a printed circuit preparatorily to the insertion of the package into a reflow furnace for melting the solder is being studied in a certain quarter of the industry. This measure, however, results in impairing the advantage of BGA as a package of high density because the number of input and output terminals is decreased proportionately to the area to be sacrificed for the insertion of the spacer. Moreover, the spacer serves solely as a heat spreader for transmitting heat to the substrate and plays absolutely no function electrically and disrupts all efforts of cutting the total number of components.

The problems remarked above are not limited to the BGA packages but are encountered by semiconductor devices of flip chip structures possessed of solder bumps as input and output terminals and surface-mounted products similarly using plural semiconductor devices in the form of modules. The connection of the input and the output terminal of a semiconductor device to a package or a printed circuit has been heretofore implemented predominantly by the wire bonding as already described above. This connection is becoming increasingly difficult because the capillary of wire bonding increases in proportion as the pad pitches of the semiconductor devices decrease. Further, the resultant addition to the length of connection augments the inductance to the extent of intolerably degrading the electrical characteristics. As a means to decrease this unduly large inductance, the use of bumps in packaging a semiconductor device has a bright prospect. This approach, however, incurs the same problem as the BGA package made of a ceramic material on account of a large difference in thermal expansion between the semiconductor device and a printed circuit.

In the electronic components which are possessed of connecting projections (bumps) as input and output terminals for the conventional BGA packages made of ceramic materials and the semiconductor elements of flip chip structures, when they succumb to the thermal hysteresis due to a change in the ambient temperature at the step of reflow soldering during the packaging of such an electronic component as on a printed circuit or during the course of actual use of the electronic component, the difference in thermal expansion between the ceramic package or semiconductor and the printed circuit gives rise to stress or strain in the connecting parts with solder bumps. The stress or strain brings about the problem of causing the connected parts to sustain fracture due to thermal fatigue, inflicting a fracture by stress on the ceramic package or semiconductor element itself, and degrading the reliability of connection.

SUMMARY OF THE INVENTION

This invention, therefore, has for an object thereof the provision of an electronic component which is possessed of connecting bumps as input and output terminals with the reliability of the connection thereof improved without a sacrifice of the advantage of the connecting bumps contributing to increase the number of terminals and decreasing the size of pitches and an electronic component connecting structure which uses such an electronic component as mentioned above and excels in reliability.

A first electronic component according to the present invention is characterized by comprising an electronic component proper possessed of a conductive layer and a terminal forming face possessed of a plurality of electrodes electrically connected to the conductive layer and a group of connecting bumps made of not less than two kinds of materials different in melting point and formed as input and output terminals on the plurality of electrodes. The group of connecting bumps formed of not less than two kinds of materials different in melting point comprises a first group of connecting bumps and a second group of connecting bumps disposed in parts of concentrated stress and made of a metallic material having a higher melting point than the material of the first group of connecting bumps. More specifically, the group of connecting bumps comprises a first group of connecting bumps disposed on the inner peripheral part side of the terminal forming face and a second group of connecting bumps disposed on the outer peripheral part side of the terminal forming face and made of a metallic material having a higher melting point than the material of the first group of connecting bumps.

A second electronic component according to the present invention is characterized by comprising an electronic component proper possessed of a conductible layer and a terminal forming face possessed of a plurality of electrodes electrically connected to the conductive layer and a group of connecting bumps made of not less than two materials different in melting point and formed as input and output terminals on the plurality of electrodes. The group of connecting bumps formed of not less than two materials of different melting points comprises a first group of connecting bumps and a second group of connecting bumps disposed in parts of concentrated stress and made of a metallic material having a higher melting point than the material of the first group of connecting bumps. More specifically, the group of connecting bumps comprises a first group of connecting bumps disposed on the inner peripheral part side of the terminal forming face and a second group of connecting bumps disposed on the outer peripheral part side of the terminal forming face and made of a metallic material having a higher melting point than the first group of connecting bumps.

An electronic component connecting structure according to the present invention is characterized by comprising a first electronic component possessed of a group of connecting bumps as input and output terminals and a second electronic component electrically connected to the first electronic component through the medium of a group of connecting parts formed of the group of connecting bumps and formed of not less than two kinds of connecting parts different in shape of the group of connecting parts. The group of connecting parts formed of not less than two kinds of connecting parts different in shape comprises either a first group of connecting parts and a second group of connecting parts disposed in parts of concentrated stress and formed in the shape of an hourglass or a cylinder or a first group of connecting parts having a molten shape and a second group of connecting parts disposed in parts of concentrated stress and having a non-molten shape. More specifically, the group of connecting parts comprises either a first group of connecting parts disposed on the inner peripheral part side of an area forming a group of connecting parts and a second group of connecting parts disposed on the outer peripheral part side and formed in the shape of an hourglass or a cylinder or a first group of connecting parts disposed on the inner peripheral part side of the area forming a group of connecting parts and a second group of connecting parts disposed on the outer peripheral part side and formed in a non-molten shape.

As concrete examples of the electronic component of this invention and the first electronic component in the electronic component connecting structure of this invention, semiconductor packages formed chiefly of a ceramic material and possessed of a group of connecting bumps as input and output terminals, i.e. semiconductor packages using ceramic substrates at least in parts for forming the group of connecting bumps and surface-mount components having mounted on ceramic substrates thereof such semiconductor devices as are possessed of a group of connecting bumps as input and output terminals or plural semiconductor devices may be cited.

As concrete examples of the second electronic component in the electronic component connecting structure of this invention, such packaged boards as substrates for printed circuits having mounted thereon the first electronic component mentioned above and, where the first electronic component is a semiconductor element, packages made of resinous materials may be cited. As concrete examples of the electronic component connecting structure according to this invention, therefore, semiconductor modules such as substrates for printed circuits which are formed by having the aforementioned semiconductor packages, surface-mounted components, semiconductor elements (bare chips), etc. mounted on packaging boards and such semiconductor components as are formed by having semiconductor elements mounted on packages made of a resinous material may be cited.

As concrete examples of the material of which the groups of connecting bumps contemplated by this invention are made, such metallic materials as contain at least one member selected from the group consisting of Pb, Sn, Au, In, and Bi may be cited. Thus, well-known solder materials are usable for the material under discussion. Specifically, such solder materials and other materials are selectively used so as to meet the relevant conditions as will be described specifically hereinbelow. The shape in which the group of connecting bumps must be distributed is preferably a circle. It may be a rectangle.

This invention is prominently effective particularly when the difference in thermal expansion coefficient between an electronic component and a printed circuit (a second electronic component) on which the electronic component is mounted is not less than $5 \times 10^{-6}$/K, though depending on the thermal hysteresis to which the electronic component or an electronic component connecting structure succumbs. When the difference in thermal expansion coefficient between the electronic component and the printed circuit for mounting the electronic component thereon exceeds $5 \times 10^{-6}$/K, the connecting parts which are formed with the connecting bumps are liable to sustain a crack or a fracture because the stress and the displacement generated particularly owing to the difference in thermal expansion is unduly large. This invention attains effective prevention of such defective connections as originate in a crack or a fracture sustained in the connecting parts. The term "connecting part" as used in this invention refers to a connecting bump which is in the form resulting from such a heat treatment as the solder reflow.

It has been ascertained that when such a test as the heat cycle test which aims to determine reliability with respect to temperature fluctuations establishes the presence of a difference in thermal expansion coefficient between an electronic component possessed of connecting bumps and a printed circuit for mounting the electronic component thereon, a change of temperature gives rise to internal stress and inflicts a deformation such as warp on the printed circuit and the warp in the printed circuit entails occurrence of a crack particularly inside a connecting bump (a connecting part therewith) positioned on the outer peripheral part side of a terminal forming face (a terminal forming area) or a connecting bump (a connecting part therewith) disposed near the position directly below a semiconductor element, with the result that defective connection will ensue from a decrease in strength of connection or an increase in resistance of connection.

The present invention has been perfected on the basis of this knowledge. It resides in discriminating between the connecting bumps which exist in the parts encountering large displacements and concentrated stress and the connecting bumps which exist in the parts incurring only small displacements. To be specific, this invention allows the stress or strain exerted on a group of connecting bumps or the group of connecting parts formed thereof to be alleviated by causing the connecting bumps in the parts of concentrated stress to acquire exalted strength or preventing the connecting bumps (connecting parts therewith) from being affected by a displacement.

Now, this invention will be described in detail below.

The first electronic component of this invention aims to eliminate the influence of displacement on the connecting bumps existing in the parts encountering a large displacement and concentrated stress (parts of concentrated stress) by forming groups of connecting bumps with not less than two kinds of connecting bumps different in melting point.

Specifically, when an electronic component possessed of such groups of connecting bumps as are mentioned above is mounted as on a printed circuit, a large displacement occurs as on the outer peripheral part side of the area which seats the groups of connecting bumps and, therefore, stress is concentrically exerted on the connecting bumps positioned in that part. As a result, it is necessary that a first group of connecting bumps which contribute to the mechanical union of an electronic component and a printed circuit be disposed on the inner peripheral part side of the area for seating the groups of connecting bumps and a second group of connecting bumps made of a metallic material having a higher melting point than the material of the first group of connecting bumps be disposed on the outer peripheral part side.

This concentrated exertion of stress possibly occurs in those connecting bumps which are positioned near the part directly below a semiconductor element, depending on the particular combination of the semiconductor element with such an electronic component as the semiconductor package. In a case of this sort, it is necessary that a second group of connecting bumps which are made of a metallic material having a high melting point be disposed near the part directly below the semiconductor element and a first groups of connecting bumps which contribute to the mechanical union of the electronic component with the printed circuit be disposed at other position.

When the structure obtained as described above is subjected, for example, to solder reflow at the melting temperature of the material of the first group of connecting bumps, the first group of connecting bumps are melted and joined to the printed circuit. In contrast, the second group of connecting bumps are allowed to keep the initial shape (unmelted shape) thereof substantially intact and, at the same time, electrically connected to the printed circuit by virtue of physical contact. As a result, the printed circuit can be prevented from being warped and, at the same time, the second group of connecting bumps which exist at the position fated to produce large displacement are no longer affected directly by the displacement. The stress or the strain which is exerted on the groups of connecting bumps, therefore, can be alleviated and the defective connection due to a crack or a fracture in the connecting parts can be effectively precluded.

Further, since the second group of connecting bumps (the connecting parts in the unmelted shape) function to keep the distance of connection intact, the group of connecting parts formed by the first group of connecting bumps (the terminals resulting from the union as by solder reflow) are allowed to assume the shape of an hourglass or a cylinder which excels in mechanical strength of union. As a result, the characteristic of electrical connection manifested by the second group of connecting bumps can be improved and, at the same time, the reliability of mechanical union of the electronic component and the printed circuit can be exalted. The effect mentioned above can be further augmented by controlling the size of the first group of connecting bumps and that of the second group of connecting bumps.

In consideration of the workability of the connecting bumps pertinent hereto and the characteristic of shape retention manifested by the second group of connecting bumps, it is necessary that the difference in melting point between the first and the second connecting bumps be not less than 50 K. If this difference in melting point is less than 50 K, the heat treatment as for solder reflow does not permit easy control of the temperature thereof and possibly induces fusion of even the second group of connecting bumps.

The second electronic component of this invention aims to enable the connecting bumps which exist in the parts generally encountering large displacement and concentrated stress to acquire increased strength by forming not less than two kinds of connecting bumps different in mechanical strength. In such solder materials as mentioned above, for example, the In type solder materials are characterized by excelling the solder materials of the Pb type, the Sn type, the Bi type, etc. in mechanical strength.

The reliability of connection of the second group of connecting bumps (the connecting parts therewith) which are disposed on the outer peripheral part side producing large displacement and concentrated stress by disposing the first group of connecting bumps on the inner peripheral part side of the area for seating the group of connecting bumps and the second group of connecting bumps made of a metallic material having higher strength than the material for the first group of connecting bumps such as, for example, a solder material of the In type on the outer peripheral part side. Similarly, the reliability of connection of the second group of connecting bumps (the connecting parts therewith) disposed near the position directly below the semiconductor element constituting a part for concentrated stress can be exalted by disposing the second group of connecting bumps made of a metallic material having high strength such as, for example, a solder material of the In type near the position directly below the semiconductor element and the first group of connecting bumps at the other position.

Further, by controlling the melting point of the first group of connecting bumps and that of the second group of connecting bumps, and more specifically by forming the second group of connecting bumps with a metallic material having a lower melting point than the material of the first group of connecting bumps, the group of connecting parts formed by the second group of connecting bumps are enabled to be formed in the shape of an hourglass or a cylinder which excels in mechanical strength of union and in mechanical strength of itself because the first group of connecting bumps function to keep the distance of connection intact. The reliability of the connecting parts formed by the second group of connecting bumps, therefore, can be further augmented.

Incidentally, the control of the shape of the first group of connecting bumps and that of the second group of connecting bumps mentioned above can be realized not merely by adjusting the difference in melting point between the groups of connecting bumps but also by selecting the combination of solder balls with a solder paste serving as an adhesive agent therefor or controlling the shape (size, for example) of the solder balls.

The electronic component connecting structure of the present invention aims to impart enhanced strength to the connecting parts generally producing large displacement and concentrated stress or eliminate the exertion of the influence of displacement on the connecting parts by causing the group of connecting parts remaining after the connection of a first electronic component and a second electronic component to be formed of not less than two kinds of connecting parts different in shape.

Specifically, the shapes which the connecting bumps assume after being melted are broadly divided into the shape of an hourglass, that of a cylinder, and that of a drum. In these shapes of the connecting bumps after the melting, that of a cylinder or that of an hourglass, particularly the shape of an hourglass, excels in mechanical strength of itself or of a joined part. The reliability of the second group of connecting parts which produce large displacement and attract concentrated stress can be exalted, therefore, by causing the second group of connecting bumps disposed on the outer peripheral part side to be formed in the shape of an hourglass or a cylinder after being connected and consequently forming a second group of connecting parts in the shape of an hourglass or a cylinder by virtue of the difference in melting point between the groups of connecting bumps or the particular combination of solder balls and a solder paste as described above with respect to the second electronic component.

The same remarks hold good for the structure wherein the part concentrated stress falls at the position directly below the semiconductor element.

Then, the influence of displacement on the second group of connecting bumps which generally produce large stress and attract concentrated stress can be eliminated by forming the first group of connecting bumps on the inner peripheral part side in a molten shape (the shape of a hourglass, a cylinder, or an hourglass) and, at the same time, forming the second group of connecting bumps on the outer peripheral part side in an unmelted shape (the shape of a ball) as by virtue of the difference in melting point between groups of connecting bumps as described above with respect to the first electronic component. As a result, the reliability pertinent to the second group of connecting parts can be exalted. The same remarks hold good for the structure wherein the part of concentrated stress falls in the position directly below the semiconductor element.

Incidentally, the control of the shape of the first group of connecting parts and that of the second group of connecting parts mentioned above can be realized not merely by adjusting the difference in melting point between the groups of connecting bumps but also by selecting the combination of solder balls with a solder paste serving as an adhesive agent therefor or controlling the shape (size, for example) of the solder balls.

Since the electronic component and the electronic component connecting structure of this invention are enabled to decrease the internal stress thereof by virtue of the difference in melting point or the difference in mechanical strength between the groups of connecting bumps and the difference in shape between the groups of connecting bumps after the formation thereof as described above, the development of a crack generated in the connecting bumps (the connecting parts therewith) owing to the warp occurring in the printed circuit (the second electronic component) can be curbed and the decline of mechanical strength as of creep can be repressed.

DESCRIPTION OF THE PREFERRED EMBODIMENTS

Now, this invention will be described more specifically below with reference to working examples.

EXAMPLE 1

Figure 1:
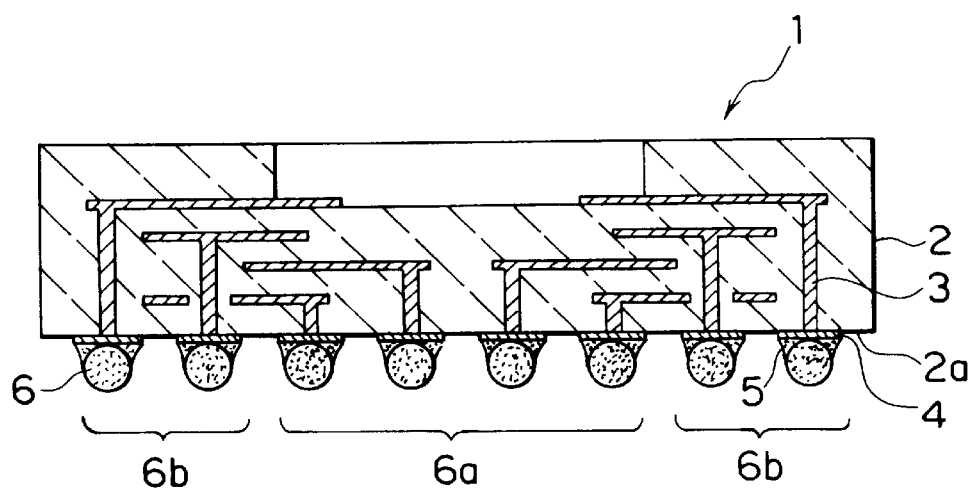
FIG. 1 is a cross section schematically showing the construction of a BGA package made of a ceramic material according to Example 1 of this invention.
Figure 2:
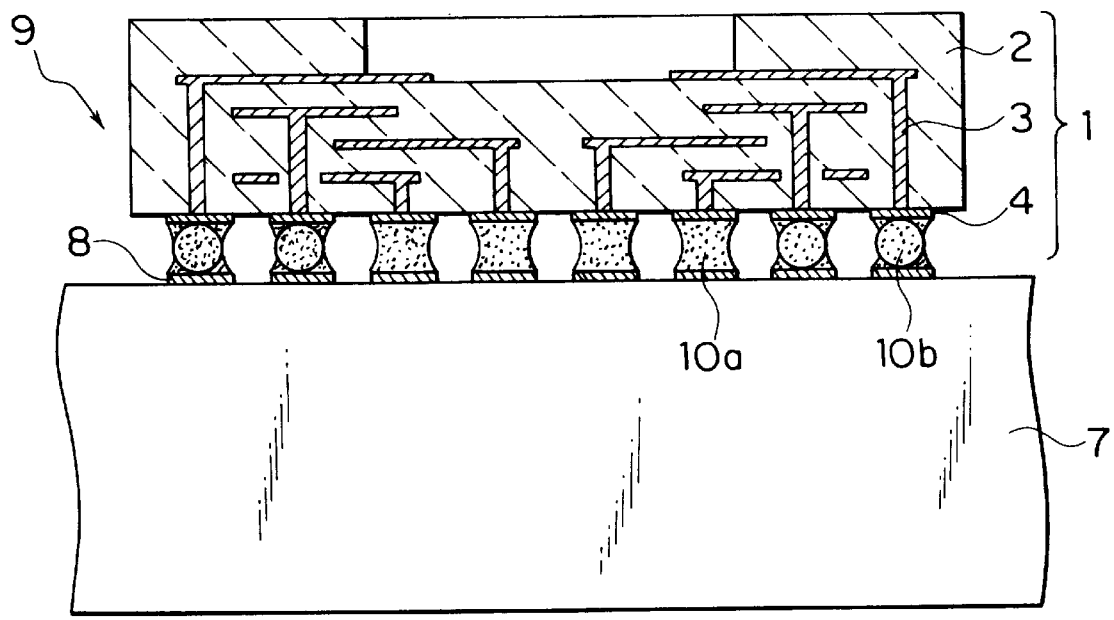
FIG. 2 is a cross section schematically showing a module constructed by mounting the BGA package of ceramic material shown in FIG. 1 on a printed circuit.

FIG. 1 and FIG. 2 schematically showing the construction of one example of embodying the electronic component and the electronic component connecting structure of this invention respectively in a BGA package made of a ceramic material and a semiconductor module constructed by mounting this BGA package on a printed circuit.

In FIG. 1, 1 stands for a BGA package made of a ceramic material. This ceramic BGA package 1 is possessed of a multilayer ceramic circuit substrate 2 as a package proper. The multilayer ceramic circuit substrate 2 is manufactured, for example, by forming through holes in a ceramic green sheet, printing a surface pattern with tungsten metallized paste and filling the through holes with the metallized paste, then contact superposing relevant sheets, and sintering the resultant laminate in a reducing ambience. In this example, a ceramic material of alumina was used as the main material for the green sheet.

The multilayer ceramic circuit substrate 2 is possessed of an inner conductive layer 3 which is formed by filling the through holes mentioned above with the metallized paste. In prescribed areas of a main surface 2a destined to form a terminal forming face, circular pads 4 electrically connected to the inner conductive layer 3 are formed as electrodes. The circular pads 4 are parts of the W metallized layer obtained by the simultaneous sintering technique mentioned above. They are given a Ni/Au plating treatment in consideration of the ease of soldering.

To the circular pads 4, solder balls 6 are joined one each through the medium of solder paste 5. The area in which these solder balls 6 are formed is divided into an outer peripheral part area and an inner peripheral part area. Solder balls 6a made of a low temperature solder are joined to the inner peripheral part area and solder balls 6b made of a high temperature solder to the outer peripheral part area. In the present example, the solder balls 6 were arrayed rectangularly in 44 columns and 44 rows, inclusive of the high temperature solder balls 6b arrayed in 8 columns and 8 rows on the outer peripheral part side of the rectangle.

The low temperature solder balls 6a and the high temperature solder balls 6b mentioned above are joined as follows. First, a Sn63%–Pb37% eutectic solder paste 5 is applied to the circular pads 4 by printing with the aid of a metal screen 200 μm in thickness. On the layer of the solder paste 5, the low temperature solder balls 6a of an Sn63%–Pb37% eutectic solder are mounted on the inner peripheral part area and the high temperature solder balls 6b of an Sn10%–Pb90% high temperature solder are mounted on the outer peripheral part area with the aid of a jig. Thereafter, the solder paste 5 is melted to join the low temperature solder balls 6a and the high temperature solder balls 6b.

The solder balls 6a and 6b which are joined onto the circular pads 4 constitute a group of connecting bumps. To be more specific, the low temperature solder balls 6a constitute a first group of connecting bumps and the high temperature solder balls 6b a second group of connecting bumps.

Then, the ceramic BGA package 1 possessed of such groups of bumps constructed as described above was mounted on a glass epoxy type printed circuit 7 as shown in FIG. 2. The packaging was carried out by applying solder paste by printing to terminals 8 of the glass epoxy type printed circuit 7 opposed to the connecting bumps (solder balls) 6 on the package 1 side, mounting the ceramic BGA package 1 on the resultant layers of solder paste, and reflowing the connecting bumps. The solder reflow temperature was fixed at 473 K in conformity with the melting point of the Sn63%–Pb37% eutectic solder.

When connecting parts 10 which were consequently formed in a semiconductor-mounted module (an electronic component connecting structure) 9 obtained as described above were visually examined, it was found that connecting parts 10a formed by the low temperature solder balls 6a assumed the shape of an hourglass (molten shape) in consequence of the fusion of the low temperature solder balls 6a and connecting parts 10b formed by the high temperature solder balls 6b retained the shape of a ball (unmelted shape). The connecting parts 10a in the molten shape constituted a first group of connecting parts and the connecting parts 10b in the unmelted shape) constituted a second group of connecting parts. Through the medium of the connecting parts 10b formed of the high temperature solder balls 6b in the unmelted shape, a fully satisfactory electrical connection was established between the ceramic BGA package 1 and the glass epoxy type printed circuit 7.

Incidentally, the terminals formed of the low temperature solder balls 6a of eutectic solder are allowed to assume various shapes such as an hourglass, a cylinder, or a drum by controlling the solder paste and the amount of solder supplied to the solder balls, for example. Among other shapes, the shape of an hourglass proves particularly advantageous.

In comparison with this invention, an alumina ceramic BGA package having formed therein a group of connecting bumps made exclusively of low temperature solder balls of a Sn63%–Pb37% eutectic solder was manufactured. This comparative BGA package was mounted on a glass epoxy type printed circuit in the same manner as in the example cited above. The connecting parts consequently formed in the comparative semiconductor-mounted module invariably assumed the shape of an hourglass owing to the weight of the package.

The semiconductor-mounted modules (the electronic component connecting structures) 9 obtained in the working example and the comparative example as described above were tested to determine the reliability of their respective connecting parts 10 as follows. First, they were subjected to a cooling-heating cycle test using a unit cycle of 338 K-30 min+RT-5 min +398 K-30 min and, at the end of a prescribed number of cycles, were examined to rate the degree of reliability. The magnitude of electrical resistance was used as the criterion for discrimination between acceptability and rejectability of the reliability on the principle that a sample showing an electrical resistance twice the initial level would be found as rejectable. For the sake of the measurement of the electrical resistance, the printed circuit 7 was provided in advance with a circuit adapted to make this measurement through the medium of the connecting parts and the BGA package 1.

As the result of the test for reliability carried out as described above, it was confirmed that the BGA package of the comparative example which had the group of connecting bumps formed exclusively of the low temperature solder balls showed rejectable reliability of connection after 100 cycles and that the BGA package of the working example, even after 1000 cycles, showed excellent reliability of connection as evidenced by the fact that the electrical resistance was substantially unchanged from the initial level. The test results clearly indicate that the possible direct exertion of the influence of displacement on the second group of connecting parts can be precluded by disposing the high temperature solder balls 6b in the outer peripheral part of the terminal forming face 2a and forming the corresponding second group of connecting parts with the connecting parts 10b in the unmelted shape at the position generally producing large displacement. As a result, the stress or strain exerted on the connecting parts 10 can be alleviated and the defective connection due to the occurrence of a crack or a fracture in the connecting parts 10 can be effectively precluded.

Though Example 1 described above has been depicted as a case of using a Sn63%–Pb37% eutectic solder as the material for forming the low temperature solder balls 6a and a Sn10%–Pb90% high temperature solder as the material for forming the high temperature solder balls 6b, various combinations of solders can be utilized in this invention as shown in Table 1 and Table 2 below. When ceramic BGA packages and semiconductor-mounted modules were manufactured by following the procedure of Example 1 while using the various combinations of solders shown in Table 1 and Table 2, the connecting parts obtained therein were found to be invariably excellent in reliability of connection.

TABLE 1

| Sample No. | Material for bumps | | Temperature of heat treatment (K) |
| --- | --- | --- | --- |
| | Inner peripheral part area | Outer peripheral part area | |
| 1 | Sn63%-Pb37% | In50%-Pb50% | 473 |
| 2 | Sn63%-Pb37% | Sn50%-Pb50% | 473 |
| 3 | Sn63%-Pb37% | Sn50%-Pb49.5%-Sb0.5% | 473 |
| 4 | Sn63%-Pb37% | Pb52%-Sn48% | 473 |
| 5 | Sn63%-Pb37% | Sn96.5%-Ag3.5% | 473 |
| 6 | Sn63%-Pb37% | Pb60%-In40% | 473 |
| 7 | Sn63%-Pb37% | Sn97.5%-Ag2.5% | 473 |
| 8 | Sn63%-Pb37% | Bi48%-Pb28.5%-Sn14.5%-Sb9% | 473 |
| 9 | Sn63%-Pb37% | Sn100% | 473 |
| 10 | Sn63%-Pb37% | In90%-Ag10% | 473 |
| 11 | Sn63%-Pb37% | Bi95%-Sn5% | 523 |
| 12 | Sn63%-Pb37% | Pb70%-Sn30% | 523 |
| 13 | Sn63%-Pb37% | Bi100% | 523 |
| 14 | Sn63%-Pb37% | Sn97%-Cu3% | 523 |
| 15 | Sn63%-Pb37% | Pb95%-In5% | 523 |
| 16 | Sn63%-Pb37% | Pb98%-Sb1.2%-Ga0.8% | 523 |
| 17 | Sn63%-Pb37% | Pb100% | 533 |
| 18 | In52%-Sn48% | Sn63%-Pb37% | 454 |
| 19 | In52%-Sn48% | In50%-Pb50% | 454 |
| 20 | In52%-Sn48% | Sn50%-Pb50% | 450 |

TABLE 2

| Sample No. | Material for bumps | | Temperature of heat treatment (K) |
| --- | --- | --- | --- |
| | Inner peripheral part area | Outer peripheral part area | |
| 21 | In52%-Sn48% | Sn50%-Pb49.5%-Sb0.5% | 454 |
| 22 | In52%-Sn48% | Pb52%-Sn48% | 454 |
| 23 | In52%-Sn48% | Sn96.5%-Ag3.5% | 454 |
| 24 | In52%-Sn48% | Pb60%-In40% | 454 |
| 25 | In52%-Sn48% | Sn97.5%-Ag2.5% | 454 |
| 26 | In52%-Sn48% | Bi48%-Pb28.5%-Sn14.5%-Sb9% | 454 |
| 27 | In52%-Sn48% | Sn100% | 454 |
| 28 | In52%-Sn48% | In90%-Ag10% | 454 |
| 29 | In52%-Sn48% | Bi95%-Sn5% | 454 |
| 30 | In52%-Sn48% | Pb70%-Sn30% | 454 |
| 31 | In52%-Sn48% | Bi100% | 454 |
| 32 | In52%-Sn48% | Sn97%-Cu3% | 454 |
| 33 | In52%-Sn48% | Pb95%-In5% | 454 |
| 34 | In52%-Sn48% | Pb98%-Sb1.2%-Ga0.8% | 454 |
| 35 | In52%-Sn48% | Pb100% | 454 |

Figure 3:
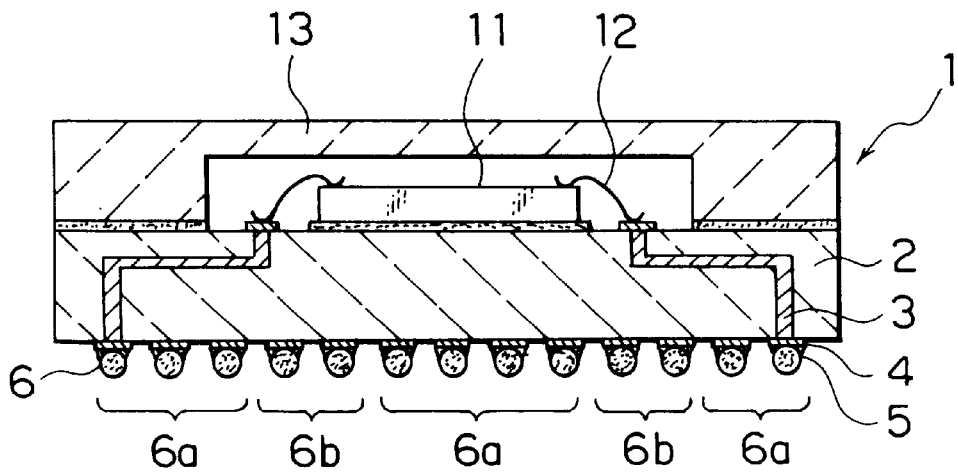
FIG. 3 is a cross section showing a modification of the BGA package of ceramic material according to Example 1.
Figure 4:
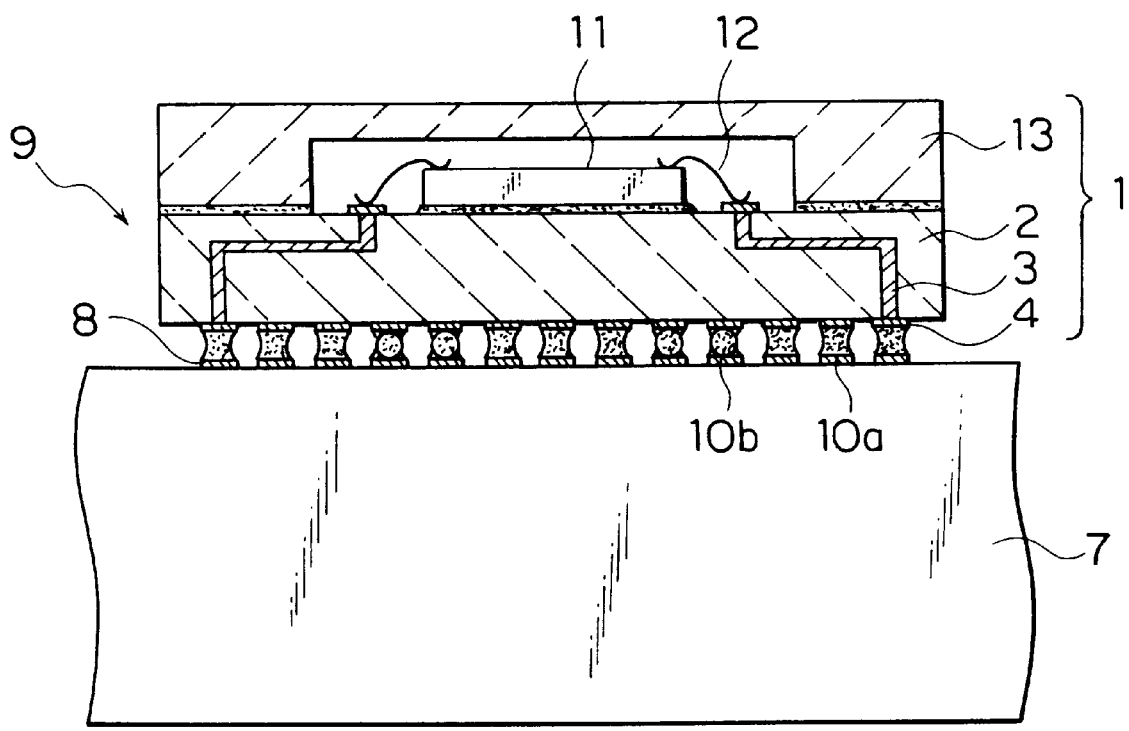
FIG. 4 is a cross section schematically showing a module constructed by mounting the BGA package of ceramic material shown in FIG. 3 on a printed circuit.

FIG. 3 and FIG. 4 are diagrams showing modifications respectively of the ceramic BGA package and the semiconductor-mounted module according to Example 1.

The ceramic BGA package 1 which is shown in FIG. 3 has a semiconductor element 11 mounted thereon. This semiconductor element 11 is electrically connected with a bonding wire 12 to the inner conductive layer 3. The semiconductor element 11 is airtightly sealed with a ceramic lid 13. In this ceramic BGA package 1, the high temperature solder balls 6b are disposed at the position directly below the terminal part of the semiconductor element 11 which constitutes the part for concentrated stress. The low temperature solder balls 6a are disposed at the other position.

FIG. 4 shows the module 9 constructed by mounting the ceramic BGA package 1 mentioned above on the glass epoxy type printed circuit 7. In this semiconductor-mounted module 9, the connecting parts 10b formed in the unmelted shape with the high temperature solder balls 6b are disposed near the position directly below the terminal part of the semiconductor element 11 destined to constitute the part for concentrated stress. The connecting parts 10a disposed at the other position assume the shape of an hourglass which is the molten shape of the low temperature solder balls 6a.

When the semiconductor-mounted module constructed as described above was tested to determine the reliability of the connected parts thereof in the same manner as in the example described above, it showed a similarly favorable result. The ceramic BGA package and the semiconductor-mounted module constructed as described above excelled in reliability particularly in the presence of the heat due to the operation of the semiconductor element 11.

EXAMPLE 2

Figure 5:
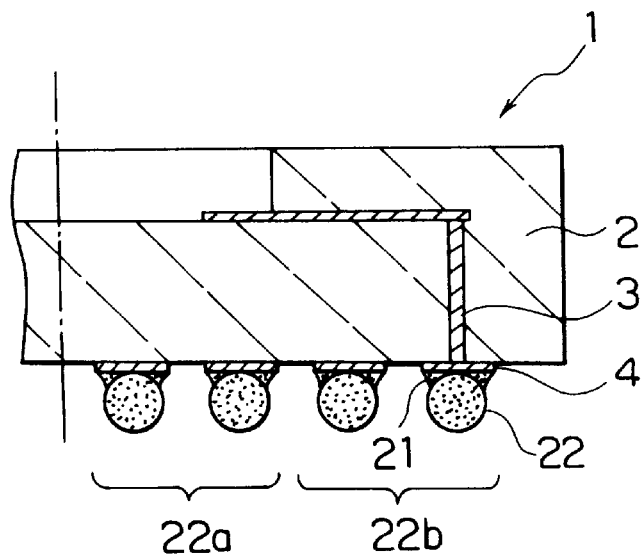
FIG. 5 is a cross section schematically showing the construction of the essential part of a BGA package made of a ceramic material according to Example 2 of the present invention.
Figure 6:
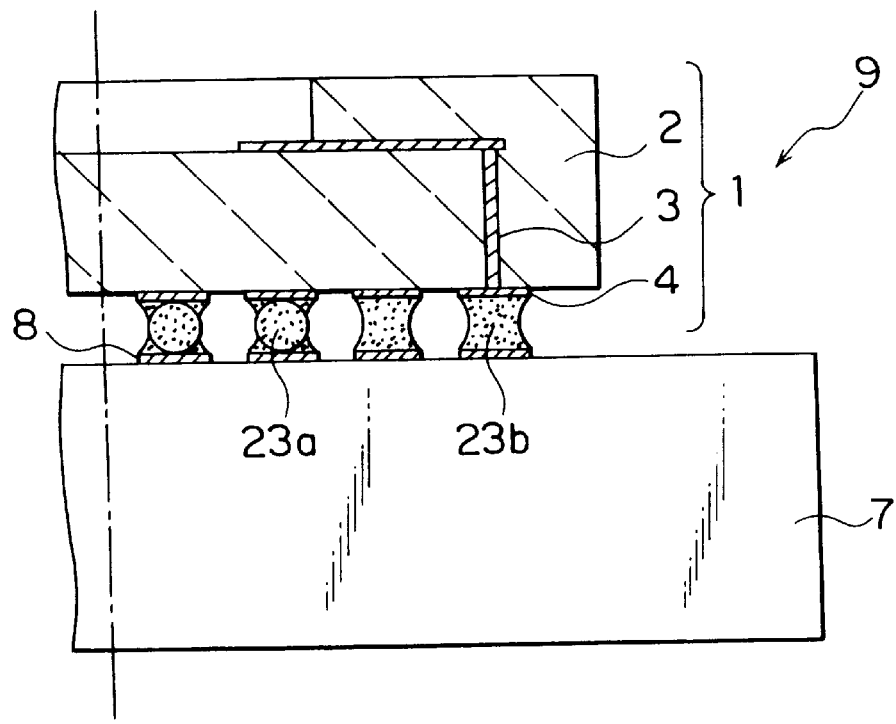
FIG. 6 is a cross section schematically showing the construction of the essential part of a module constructed by mounting the BGA package of ceramic material shown in FIG. 5 on a printed circuit.

FIG. 5 and FIG. 6 are cross sections schematically showing the constructions obtained by applying the electronic component and the electronic component connecting structure of the present invention respectively to a ceramic BGA package and a module constructed by mounting this BGA package on a printed circuit.

The ceramic BGA package 1 in this example had as the package proper thereof the multilayer ceramic circuit substrate 2 which was obtained in the same manner as in Example 1. A ceramic material of aluminum nitride was used as the main material for the green sheet.

To the circular pads 4 formed in prescribed areas of a terminal forming face 2a of the multilayer ceramic circuit substrate 2, solder balls 22 are joined one each through the medium of layers of solder paste 21. The areas for forming these solder balls 22 are divided into an outer peripheral part area and an inner peripheral part area. Solder balls 22a made of such ordinary solder as eutectic solder are joined to the inner peripheral part area and solder balls 22b made of a high strength In type solder are joined to the outer peripheral part area. In the present example, the solder balls 22 were arrayed rectangularly in 44 columns and 44 rows, inclusive of the In type solder balls 11b arrayed in 10 columns and 10 rows on the outer peripheral part side of the rectangle.

The eutectic solder balls 22a and the In type solder balls 22b mentioned above are joined as described below. First, the InSn solder paste 21 is applied by printing to the circular pads 4 with the aid of a metal screen 100 μm in thickness. On the layers of solder paste 21, the solder balls 22a made of a Sn63%–Pb37% eutectic solder are mounted in the inner peripheral part area and the In type solder balls 22b made of an In52%–Sn48% solder are mounted in the outer peripheral area by the use of a jig. Thereafter, the eutectic solder balls 22a and the In type solder balls 22b are joined by fusing the solder paste 21.

The eutectic solder balls 22a and the In type solder balls 22b which are joined onto the circular pads 4 constitute groups of connecting bumps. Specifically, the eutectic solder balls 22a form a first group of connecting bumps and the In type solder balls 22b a second group of connecting bumps. The melting point of the Sn63%–Pb37% eutectic solder is 456 K and that of the In52%–Sn48% solder is 391 K. In this case, the In type solder balls 12b correspond to the low temperature solder balls.

Then, the ceramic BGA package 1 possessed of the groups of bumps constructed as described above was mounted on the glass epoxy type printed circuit 7 as shown in FIG. 6. The packaging was carried out by applying InSn solder paste by printing to the electrode pads 8 of the glass epoxy type printed circuit 7 opposed to the connecting bumps (solder balls) 22 on the package side 1, mounting the ceramic BAG package 1 on the applied layers of the solder paste, and reflowing the connecting bumps. The solder reflow temperature was fixed at 441 K in conformity with the melting point of the In52%–Sn48% solder.

When connecting parts 23 which were consequently formed in the semiconductor-mounted module (an electronic component connecting structure) 9 obtained as described above were visually examined, it was found that connecting parts 23a formed by the eutectic solder balls 22a assumed the shape of a ball (unmelted shape) and connecting parts 23b formed by the In type solder balls 22b assumed the shape of an hourglass (molten shape) in consequence of fusion. The connecting parts 23a formed in the unmelted shape with the eutectic solder balls 22a constituted a first group of connecting parts and the connecting parts 23b formed in the molten shape with the In type solder balls 22b constituted a second group of connecting parts. Through the medium of the connecting parts 23a formed of the eutectic solder balls 22a in the unmelted shape, a fully satisfactory electrical connection was established between the ceramic BGA package 1 and the glass epoxy type printed circuit 7.

Incidentally, the terminals formed of the In type solder balls 22b are allowed to assume various shapes such as an hourglass, a cylinder, or a drum by controlling the solder paste and the amount of solder supplied to the solder balls, for example. Among other shapes, the shape of an hourglass proves particularly advantageous.

The semiconductor-mounted module (the electronic component connecting structure) 9 according to the example described above was tested for reliability of the connecting parts 23 in the same manner as in Example 1. It was consequently confirmed that this module excelled in reliability of connection as evidenced by the fact that the magnitude of electrical resistance found after 1000 cooling-heating cycles was practically the same as the initial level.

Though Example 2 described above has been depicted as a case of using an In52%–Sn48% solder as the material for forming the In type solder balls 22b and a Sn63%–Pb37% solder as the material for forming the other solder balls 22a, various combinations of solders can be utilized in this invention as shown in Table 3 below. When ceramic BGA packages and semiconductor-mounted modules were manufactured by following the procedure of Example 2 while using the various combinations of solders shown in Table 3, the connecting parts obtained therein were found to be invariably excellent in reliability of connection.

TABLE 3

| Sample No. | Material for bumps | | Temperature of heat treatment (K) |
|---|---|---|---|
| | Inner peripheral part area | Outer peripheral part area | |
| 36 | SnG3%-Pb37% | In52%-Sn48% | 454 |
| 37 | In50%-Pb50% | In52%-Sn48% | 454 |
| 38 | Sn50%-Pb50% | In52%-Sn48% | 454 |
| 39 | Sn50%-Pb49.5%-Sb0.5% | In52%-Sn48% | 454 |
| 40 | Pb58%-Sn48% | In52%-Sn48% | 454 |
| 41 | Sn96.5%-Ag3.5% | In52%-Sn48% | 454 |
| 42 | Pb60%-In40% | In52%-Sn48% | 454 |
| 43 | Sn97.5%-Ag2.5% | In52%-Sn48% | 454 |
| 44 | Bi48%-Pb28.5%-Sn14.5%-Sb9% | In52%-Sn48% | 454 |
| 45 | Sn100% | In52%-Sn48% | 454 |
| 46 | In90%-Ag10% | In52%-Sn48% | 454 |

TABLE 3-continued

| Sample No. | Material for bumps | | Temperature of heat treatment (K) |
|---|---|---|---|
| | Inner peripheral part area | Outer peripheral part area | |
| 47 | Bi95%-Sn5% | In52%-Sn48% | 454 |
| 48 | Pb70%-Sn30% | In52%-Sn48% | 454 |
| 49 | Bi100% | In52%-Sn48% | 454 |
| 50 | Sn97%-Cu3% | In52%-Sn48% | 454 |
| 51 | Pb95%-In5% | In52%-Sn48% | 454 |
| 52 | Pb98%-Sb1.2%-Ga0.8% | In52%-Sn48% | 454 |
| 53 | Pb100% | In52%-Sn48% | 454 |

Figure 7:
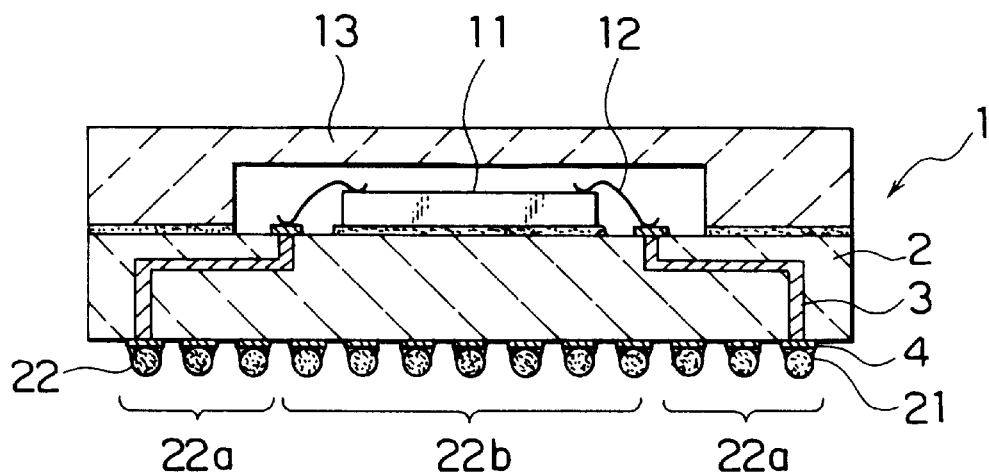
FIG. 7 is a cross section showing a modification of the BGA package of ceramic material according to Example 2 of this invention.
Figure 8:
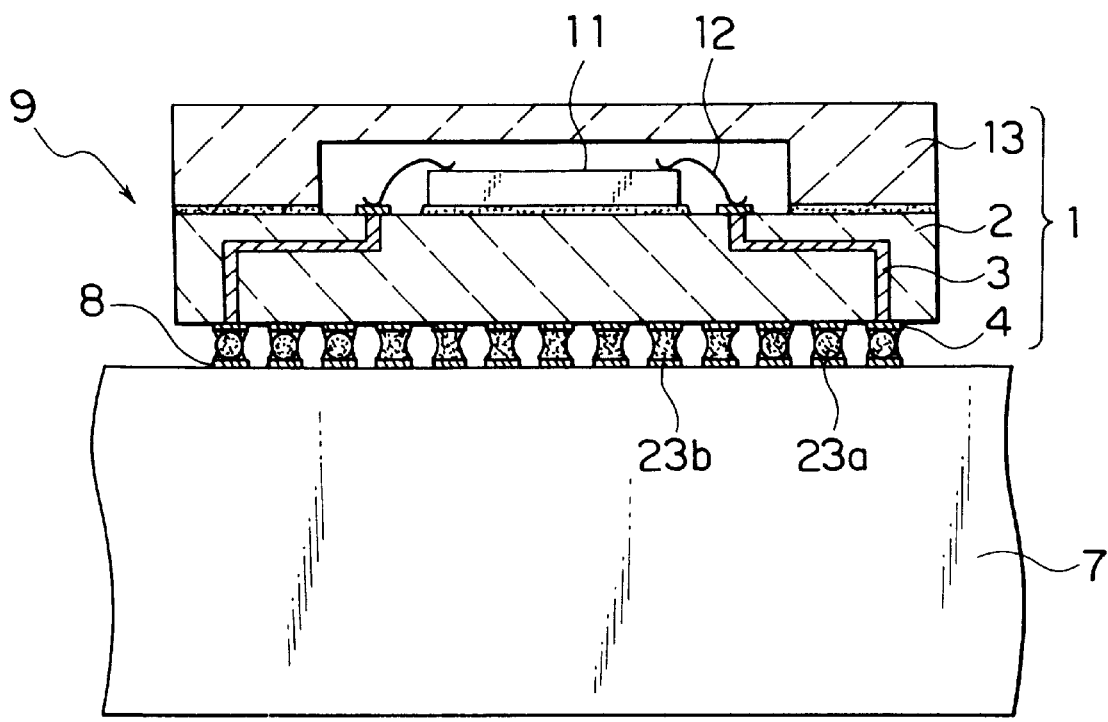
FIG. 8 is a cross section schematically showing a module constructed by mounting the BGA package of ceramic material shown in FIG. 7 on a printed circuit.

FIG. 7 and FIG. 8 are diagrams showing modifications respectively of the ceramic BGA package and the semiconductor-mounted module according to Example 2.

The ceramic BGA package 1 which is shown in FIG. 7 has a semiconductor element 11 mounted thereon. This semiconductor element 11 is electrically connected with a bonding wire 12 to the inner conductible layer 3. The semiconductor element 11 is airtightly sealed with a ceramic lid 13. In this ceramic BGA package 1, the In type solder balls 22b are disposed near the position directly below the semiconductor element 11 which constitutes the part for concentrated stress. The eutectic solder balls 22a are disposed at the other position.

FIG. 8 shows the module 9 constructed by mounting the ceramic BGA package 1 mentioned above on the glass epoxy type printed circuit 7. In this semiconductor-mounted module 9, the connecting parts 23b formed in the shape of a hourglass with the In type solder balls 22b are disposed near the position directly below the semiconductor element 11 destined to constitute the part for concentrated stress. The connecting parts 22a disposed at the other position retain the shape of the eutectic solder balls 22a intact.

When the semiconductor-mounted module constructed as described above was tested to determine the reliability of the connected parts thereof in the same manner as in the example described above, it showed a similarly favorable result. The ceramic BGA package and the semiconductor-mounted module constructed as described above excelled in reliability particularly in the presence of the heat due to the operation of the semiconductor element 11.

EXAMPLE 3

Figure 9:
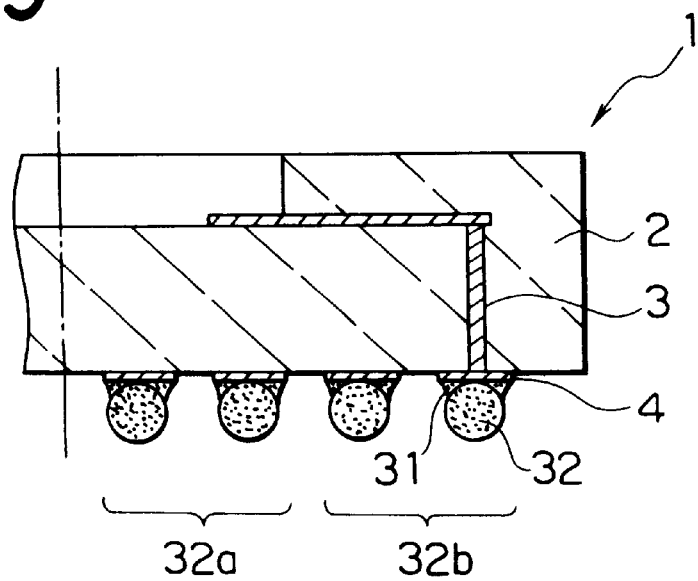
FIG. 9 is a cross section schematically showing the construction of the essential part of a BGA package made of a ceramic material according to Example 3 of this invention.
Figure 10:
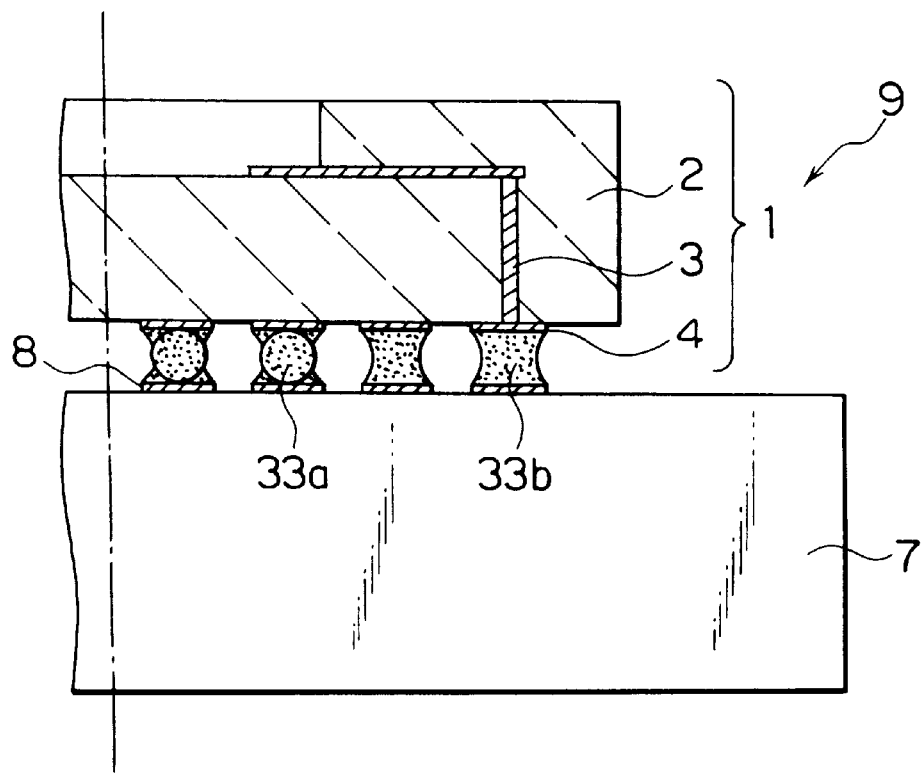
FIG. 10 is a cross section schematically showing the construction of the essential part of a module constructed by mounting the BGA package of ceramic material shown in FIG. 9 on a printed circuit.

FIG. 9 and FIG. 10 are cross sections schematically showing the constructions obtained by applying the electronic component and the electronic component connecting structure of the present invention respectively to a ceramic BGA package and a module constructed by mounting this BGA package on a printed circuit.

The ceramic BGA package 1 in this example has as the package proper thereof the same aluminum nitride multilayer ceramic circuit substrate 2 as used in Example 2. To the circular pads 4 formed in prescribed areas of the terminal forming face 2a of the multilayer ceramic circuit substrate 2, solder balls 32 are joined one each through the medium of layers of solder paste 31.

The areas for forming these solder balls 32 are divided into an outer peripheral part area and an inner peripheral part area. Solder balls 32a made of high temperature solder are joined to the inner peripheral part area and solder balls 32b made of a low temperature solder are joined to the outer peripheral part area. In this example, the solder balls 32 were arrayed rectangularly in 50 columns and 50 rows, inclusive of the low temperature solder balls 32b arrayed in 20 columns and 20 rows on the outer peripheral part side of the rectangle. These high temperature solder balls 32a and low temperature solder balls 32b are formed respectively with a Sn10%–Pb90% high temperature solder and a Sn63%–Pb37% eutectic solder in the same manner as in Example 1. Here, the high temperature solder balls 32a constitute a first group of connecting bumps and the low temperature solder balls 32b constitute a second group of connecting bumps.

Then, the ceramic BGA package 1 possessed of the groups of bumps constructed as described above was mounted on the glass epoxy type printed circuit 7 as shown in FIG. 10 in the same manner as in Example 1.

When connecting parts 33 which were consequently formed in the semiconductor-mounted module (an electronic component connecting structure) 9 obtained as described above were visually examined, it was found that connecting parts 33a formed with the high temperature solder balls 32a assumed the shape of a ball (unmelted shape) as shown in FIG. 10 and connecting parts 33b formed with the low temperature solder balls 32b assumed the shape of an hourglass (molten shape) excelling in mechanical strength and reliability of connection among other shapes assumed after fusion because the connecting parts 33a formed with the high temperature solder balls 32a functioned as a spacer for keeping the distance of connection. Through the medium of the connecting parts 33a formed of the unmelting high temperature solder balls 32a, a fully satisfactory electrical connection was established between the ceramic BGA package 1 and the glass epoxy type printed circuit 7.

The semiconductor-mounted module (the electronic component connecting structure) 9 according to the example described above was tested for reliability of the connecting parts formed of bump terminals in the same manner as in Example 1. It was confirmed that this module excelled in reliability of connection as evidenced by the fact that the magnitude of electrical resistance found after 1000 cooling-heating cycles was practically the same as the initial level.

The improvement of the reliability of the connecting parts 33 by the group of connecting bumps 32 can be attained by causing the low temperature solder balls 32b to be disposed on the outer peripheral part side and the high temperature solder balls 32a capable of functioning as a spacer for keeping the distance of connection to be disposed on the inner peripheral part side and causing the connecting parts 33b formed of the low temperature solder balls 32b on the outer peripheral part side to assume the shape of a hourglass or a cylinder excelling in mechanical strength and reliability.

Though Example 3 described above has been depicted as a case of using a Sn10%–Pb90% high temperature solder as the material for forming the high temperature solder balls 32a and a Sn63%–Pb37% eutectic solder as the material for forming the low temperature solder balls 32b, various combinations of solders can be utilized in this invention as shown in Table 4 below. When ceramic BGA packages and semiconductor-mounted modules were manufactured by following the procedure of Example 3 while using the various combinations of solders shown in Table 4, the connecting parts obtained therein were found to be invariably excellent in reliability of connection.

TABLE 4

| Sample No. | Material for bumps | | Temperature of heat treatment (K) |
|---|---|---|---|
| | Inner peripheral part area | Outer peripheral part area | |
| 54 | In50%-Pb50% | Sn63%-Pb37% | 473 |
| 55 | Sn50%-Pb50% | Sn63%-Pb37% | 473 |
| 56 | Sn50%-Pb49.5%-Sb0.5% | Sn63%-Pb37% | 473 |
| 57 | Pb58%-Sn48% | Sn63%-Pb37% | 473 |
| 58 | Sn96.5%-Ag3.5% | Sn63%-Pb37% | 473 |
| 59 | Pb60%-In40% | Sn63%-Pb37% | 473 |
| 60 | Sn97.5%-Ag2.5% | Sn63%-Pb37% | 473 |
| 61 | Bi48%-Pb28.5%-Sn14.5%-Sb9% | Sn63%-Pb37% | 473 |
| 62 | Sn100% | Sn63%-Pb37% | 473 |
| 63 | In90%-Ag10% | Sn63%-Pb37% | 473 |
| 64 | Bi95%-Sn5% | Sn63%-Pb37% | 523 |
| 65 | Pb70%-Sn30% | Sn63%-Pb37% | 523 |
| 66 | Bi100% | Sn63%-Pb37% | 523 |
| 67 | Sn97%-Cu3% | Sn63%-Pb37% | 523 |
| 68 | Pb95%-In5% | Sn63%-Pb37% | 523 |
| 69 | Pb98%-Sb1.2%-Ga0.8% | Sn63%-Pb37% | 523 |
| 70 | Pb100% | Sn63%-Pb37% | 523 |

Figure 11:
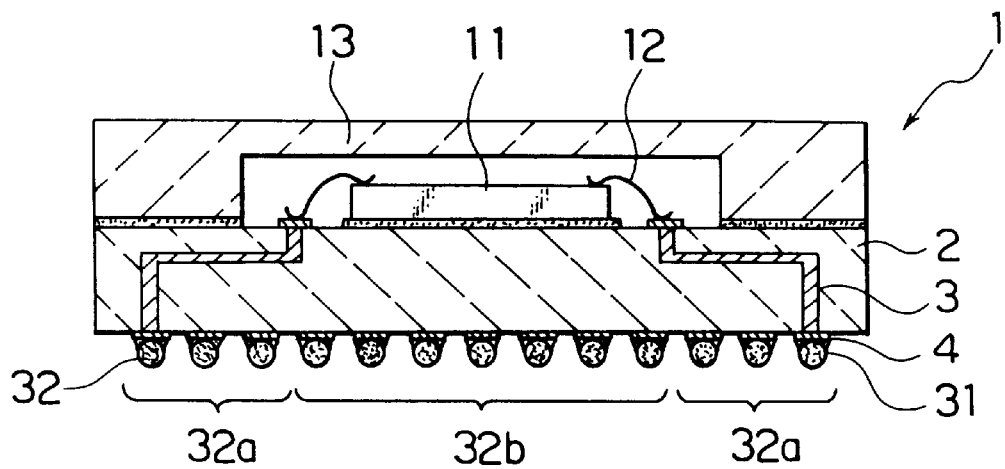
FIG. 11 is a cross section showing a modification of the BGA package of ceramic material according to Example 3 of this invention.
Figure 12:
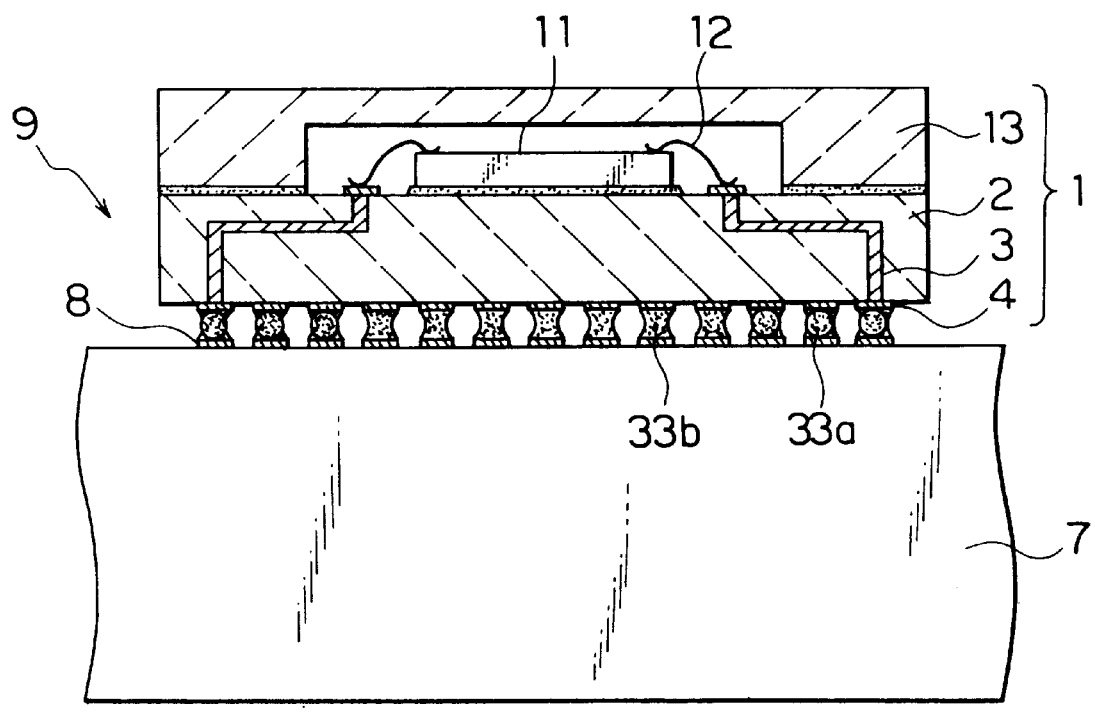
FIG. 12 is a cross section schematically showing a module constructed by mounting the BGA package of ceramic material shown in FIG. 11 on a printed circuit.

FIG. 11 and FIG. 12 are diagrams showing modifications respectively of the ceramic BGA package and the semiconductor-mounted module according to Example 3.

The ceramic BGA package 1 which is shown in FIG. 11 has a semiconductor element 11 mounted thereon. This semiconductor element 11 is electrically connected with a bonding wire 12 to the inner conductible layer 3. The semiconductor element 11 is airtightly sealed with a ceramic lid 13. In this ceramic BGA package 1, the low temperature solder balls 32b are disposed near the position directly below the semiconductor element 11 which constitutes the part for concentrated stress. The high temperature solder balls 32a are disposed at the other position.

FIG. 12 shows the module 9 constructed by mounting the ceramic BGA package 1 mentioned above on the glass epoxy type printed circuit 7. In this semiconductor-mounted module 9, the connecting parts 33b formed in a molten shape with the low temperature solder balls 32b are disposed near the position directly below the semiconductor element 11 destined to constitute the part for concentrated stress. The connecting parts 33a disposed at the other position retain the shape of the high temperature solder balls 32a intact. The connecting parts 33b acquire the shape of a hourglass which excels in mechanical strength and reliability of connection among other molten shapes because the connecting parts 33a formed of the high temperature solder balls 32a function as a spacer for keeping the distance of connection.

When the semiconductor-mounted module constructed as described above was tested to determine the reliability of the connected parts thereof in the same manner as in the example described above, it showed a similarly favorable result. The ceramic BGA package and the semiconductor-mounted module constructed as described above excelled in reliability particularly in the presence of the heat due to the operation of the semiconductor element 11.

EXAMPLE 4

Figure 13:
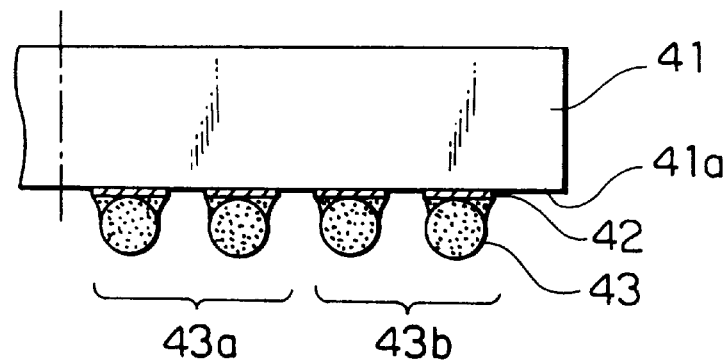
FIG. 13 is a cross section schematically showing the construction of the essential part of an LSI according to Example 4 of this invention.
Figure 14:
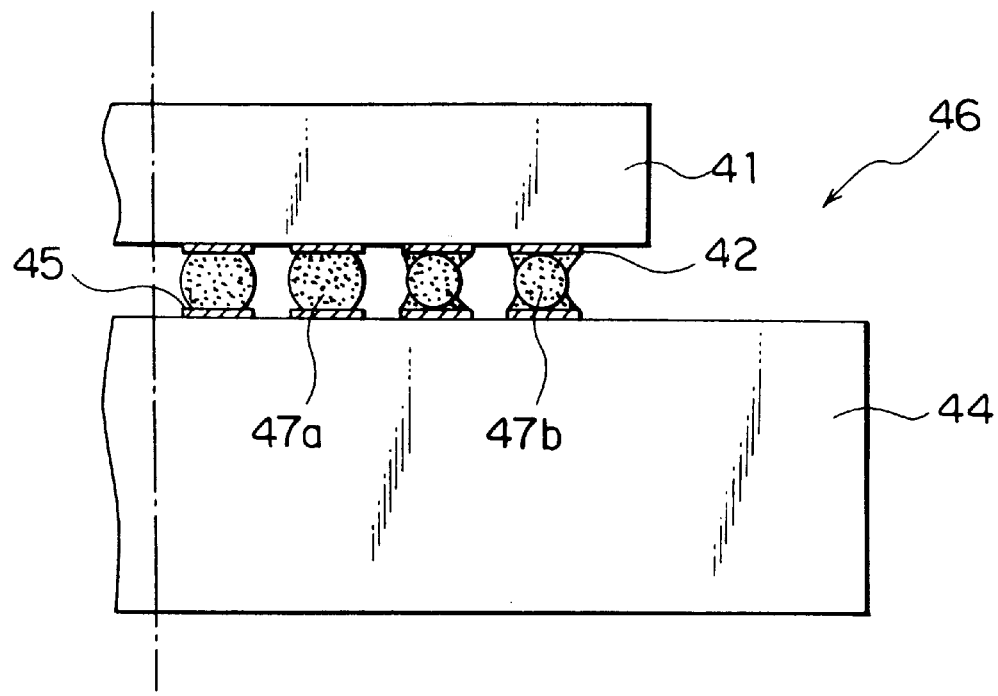
FIG. 14 is a cross section schematically showing the construction of the essential part of a module constructed by mounting the LSI shown in FIG. 13 on a printed circuit.

FIG. 13 and FIG. 14 are cross sections schematically showing the constructions obtained by applying the electronic component and the electronic component connecting structure of the present invention respectively to an LSI of the flip chip structure and a module constructed by mounting this LSI on a printed circuit.

In FIG. 13, 41 stands for an LSI. Rectangular pads 42 are formed one each in prescribed areas of a terminal forming face 41a of this LSI 41. Solder balls 43 are joined one each onto the rectangular pads 42. The areas for forming the solder balls 43 are divided into an external peripheral part area and an inner peripheral part area. Solder balls 43a made of low temperature solder are joined to the inner peripheral part area and solder balls 43b made of high temperature solder to the outer peripheral part area. In this example, the solder balls 43 were arrayed rectangularly in 12 columns and 12 rows, inclusive of the high temperature solder balls 43b arrayed in 4 columns and 4 rows on the outer peripheral part side of the rectangle.

The low temperature solder balls 43a and the high temperature solder balls 43b described above are set in place as follows. First, the rectangular pads 42 are obtained by forming a conductive layer such as of Ti/Ni/Cu on the electrode of the LSI 41, then masking the part excepting the areas for the pads with an insulator, electroplating the masked surface with SnPb, and subsequently peeling the insulator thereby removing the conductive layer from the part excepting the areas for the pads. Then, by applying flux to the upper surface of these rectangular pads 42, mounting the low temperature solder balls 43a made of a Sn63%–Pb37% eutectic solder one each on the inner peripheral part areas and the high temperature solder balls 43b made of a Sn10%–Pb90% high temperature solder one each on the outer peripheral part areas, and subsequently reflowing the solder, the low temperature solder balls 43a and the high temperature solder balls 43b are joined to the LSI.

The low temperature solder balls 43a and the high temperature solder balls 43b thus joined onto the rectangular pads 42 constitute groups of connecting bumps. Specifically, the low temperature solder balls 43a constitute a first group of connecting bumps and the high temperature solder balls 43b a second group of connecting bumps.

Then, the LSI 41 possessed of the groups of bumps in the construction described above was mounted on a glass epoxy type printed circuit 44 as shown in FIG. 14. The mounting was effected by applying SnPb eutectic solder paste by printing to the upper surface of an electrode pad 45 of the glass epoxy type printed circuit 44 opposed to the connecting bumps (solder balls) 43 on the LSI 41 side, superposing the LSI 41 on the applied layer of the eutectic solder paste, and reflowing the solder at 473 K.

When an LSI-mounted module (electronic component connecting structure) 46 obtained as described above was visually examined to determine the shapes of connecting parts 47 in the module, it was found that connecting parts 47a made of the low temperature solder balls 43a assumed the shape of a drum (molten shape) in consequence of fusion and connecting parts 47b made of the high temperature solder balls 43b retained the shape of a ball (unmelted shape). Through the medium of the connecting parts 47b formed of the unmelting high temperature solder balls 43b, a fully satisfactory electrical connection was established between the LSI 41 and the glass epoxy type printed circuit 44. Incidentally, the terminals formed of the low temperature solder balls 43a of eutectic solder are allowed to assume various shapes such as an hourglass, a cylinder, or a drum by controlling the solder paste and the amount of solder supplied to the solder balls, for example.

In comparison with this invention, an LSI having formed therein a group of connecting bumps made exclusively of low temperature solder balls of a Sn63%–Pb37% eutectic solder was manufactured. This LSI was mounted on a glass epoxy type printed circuit in the same manner as in the example described above.

The LSI-mounted modules (electronic component connecting structure) 46 obtained in the working example and the comparative example mentioned above were tested for reliability of their connecting parts under the same conditions as used in Example 1. In the test, the LSI having formed therein a group of connecting bumps made exclusively of low temperature solder balls showed a sign of defective connection after 100 cooling-heating cycles, whereas the LSI of Example 4 was able to repress the increase of electrical resistance as evidenced by the fact that the magnitude of electrical resistance which was 43.6 mΩ at first increased to 50.1 mΩ, i.e. 1.15 times the initial level, after 1000 cycles. The data clearly indicate that the connecting parts 47 obtained in Example 4 excelled in reliability.

Structures similar to that of Example 4 described above can be realized by utilizing various combinations of solders shown in Table 1 and Table 2. Groups of connecting bumps similar to those of Example 2 and Example 3 can be effectively applied to LSI's.

This invention does not need to be limited to the mounting of semiconductor packages and LSI's but may be effectively applied to various surface-mount components so long as they are electronic components which are possessed of groups of connecting bumps as input and output terminals.

As clearly noted from the working examples cited above, the electronic component of this invention enables the reliability of connecting parts formed of connecting bumps to be improved without decreasing the number of input and output terminals by eliminating the influence of displacement on the connecting bumps in the part producing large displacement and concentrated stress or increasing the strength of such connecting bumps. The electronic component connecting structure of this invention permits improvement of the reliability of the connecting parts without decreasing the number of input and output terminals because it is capable of eliminating the influence of displacement on the connecting parts generally producing large displacement and concentrated stress and realizing the exaltation of strength of the connecting parts.

What is claimed is:

1. An electronic component for mounting on a printed circuit board comprising:

a multi-layer ceramic circuit substrate for mounting to the printed circuit board, and having a plurality of conductive layers and a main surface provided with a plurality of electrodes electrically connected to said conductive layers; and a plurality of connecting bumps formed as input and output terminals on said plurality of electrodes, said connecting bumps made of different types of material having different mechanical strengths.

2. The electronic component according to claim 1, wherein said connecting bumps comprise a first group of connecting bumps and a second group of connecting bumps, said second group of connecting bumps being disposed in an area in which stress is concentrated and made of a solder material having a higher strength than said first group of connecting bumps.

3. The electronic component according to claim 1, wherein said connecting bumps comprise a first group of connecting bumps disposed on an inner peripheral side of said main surface and a second group of connecting bumps disposed on an outer peripheral side of said main surface and made of a solder material having a higher strength than said first group of connecting bumps.

4. The electronic component according to claim 2, wherein said second group of connecting bumps are made of a solder material having a lower melting point than said first group of connecting bumps.

5. The electronic component according to claim 3, wherein said second group of connecting bumps are made of a solder material having a lower melting point than said first group of connecting bumps.

6. An electronic component connecting structure comprising:
   a first electronic component comprising a ceramic semiconductor package having a plurality of connecting bumps made of a solder material and functioning as input and output terminals on a main surface of the ceramic semiconductor package; and
   a second electronic component comprising a printed circuit board being disposed to oppose said main surface of the ceramic semiconductor package and having a plurality of electrode pads, said plurality of electrode pads being electrically connected to said first electronic component by a plurality of connecting parts formed of said plurality of connecting bumps, said plurality of connecting parts comprising at least two groups having different shapes.

7. The electronic component connecting structure according to claim 6, wherein said plurality of connecting parts comprise a first group of connecting parts and a second group of connecting parts, said second group of connecting parts having an hourglass shape and disposed in an area in which stress is concentrated.

8. The electronic component connecting structure according to claim 6, wherein said plurality of connecting parts comprise a first group of connecting parts disposed on an inner peripheral side of said main surface and a second group of connecting parts having a shape of an hourglass disposed on an outer peripheral side of said main surface.

9. The electronic component connecting structure according to claim 7, wherein said second group of connecting parts are made of a solder material having a lower melting point than said first group of connecting parts.

10. The electronic component connecting structure according to claim 9, wherein said second group of connecting parts are made of a solder material having a higher strength than said first group of connecting parts.

11. The electronic component connecting structure according to claim 8, wherein said second group of connecting parts are made of a solder material having a lower melting point than said first group of connecting parts.

12. The electronic component connecting structure according to claim 8, wherein said second group of connecting parts are made of a solder material having a higher strength than said first group of connecting parts.

* * * * *